(12) United States Patent
Ahn (10) Patent No.: US 6,909,314 B2
(45) Date of Patent: Jun. 21, 2005

(54) FLIP-FLOP CIRCUIT

(75) Inventor: Young-Man Ahn, Suwon (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 10/641,092

(22) Filed: Aug. 15, 2003

(65) Prior Publication Data

US 2004/0036517 A1 Feb. 26, 2004

(30) Foreign Application Priority Data

Aug. 22, 2002 (KR) ................................ 10-2002-0049890

(51) Int. Cl.[7] .............................................. H03K 3/289
(52) U.S. Cl. ........................ 327/202; 327/203; 327/215
(58) Field of Search ................................ 327/199–203, 327/208, 210–215, 218, 219, 225

(56) References Cited

U.S. PATENT DOCUMENTS 6,204,707 B1 * 3/2001 Hamada et al. ............. 327/202
6,630,853 B1 * 10/2003 Hamada ..................... 327/202

OTHER PUBLICATIONS

Weste et al. Principles of CMOS VLSI Design: A Systems Perspective, 1993, Addison–Wesley Publishing Company, 2nd edition p. 91.*

* cited by examiner

Primary Examiner—Long Nguyen
(74) Attorney, Agent, or Firm—Volentine, Francos & Whitt, P.L.L.C.

(57) ABSTRACT

A flip-flop circuit includes a master latch and a slave latch, where a latch operation of the slave latch is controlled by a comparison result between an output signal of the master latch and an output signal of the slave latch. For example, a master latch gate receives an input signal and outputs the input signal under control of a clock signal and an inverted clock signal. A master latch receives the signal output by the master latch gate and latches the signal output by the master latch gate under control of the clock signal and the inverted clock signal. A slave latch gate receives the signal latched by the master latch and outputs the signal latched by the master latch under control of the clock signal and the inverted clock signal. A slave latch receives the signal output by the slave latch gate and latches the signal output by the slave latch gate under control of a slave latch control signal and an inverted slave latch control signal. A comparator receives the signal output by the master latch, an inverted signal of the signal output by the master latch, the signal output by the slave latch and an inverted signal of the signal output by the slave latch, and generates the slave latch control signal and the inverted slave latch control signal.

14 Claims, 5 Drawing Sheets

FLIP-FLOP CIRCUIT

BACKGROUND OF THE INVENTION

1. Field of the Invention

The present invention generally relates to flip-flop circuits, and more particularly, the present invention relates to a flip-flop circuit which is capable of reducing the load of a clock signal line.

A claim of priority under 35 U.S.C. §119 is made to Korean Patent Application 2002-49890 filed on Aug. 22, 2002, the entire contents of which is hereby incorporated by reference.

2. Description of the Related Art

A conventional flip-flop circuit includes a master latch and a slave latch. Input data are delivered to each latch through transmission gates controlled by clock signals. The master latch and the slave latch have respective feed-back circuits, whereby a current data latched in the flip-flop circuit is maintained until a new data synchronized with the clock signal is input to the flip-flop circuit, and a feed-back status of the flip-flop circuit is controlled by the clock signal.

Figure 1:
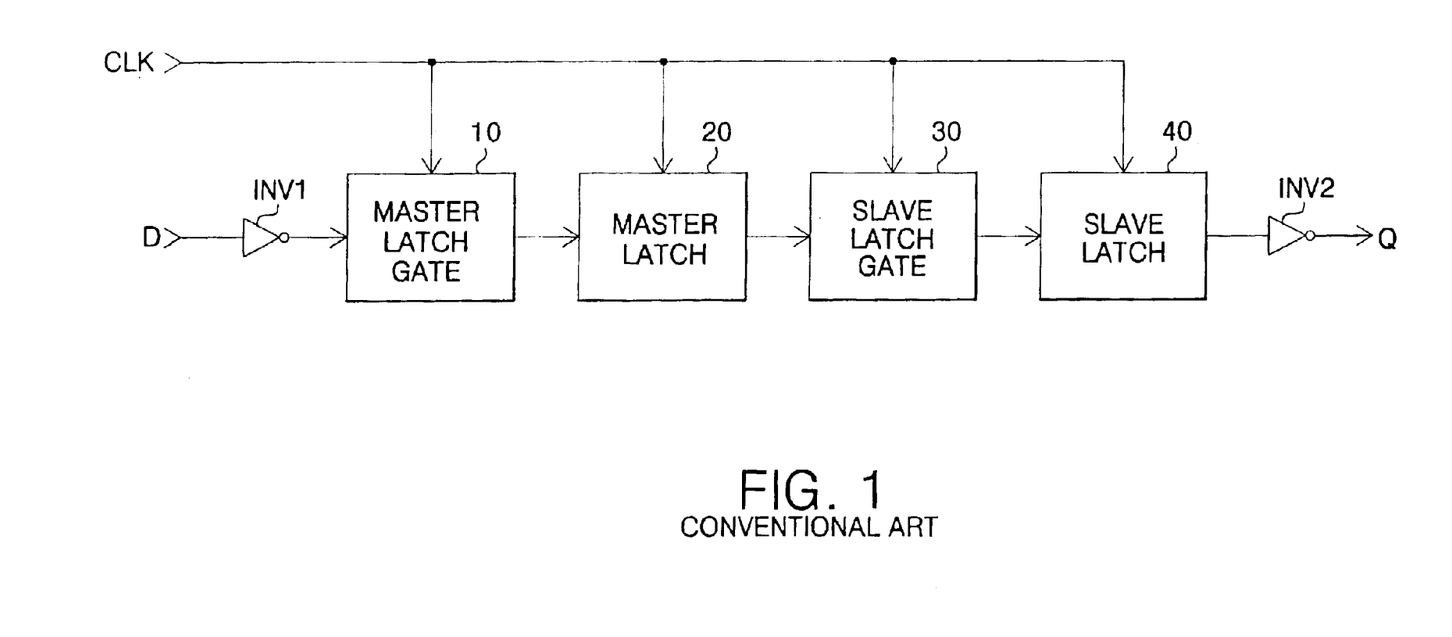
FIG. 1 is a schematic block diagram of a flip-flop circuit in accordance with the conventional art.
Figure 2:
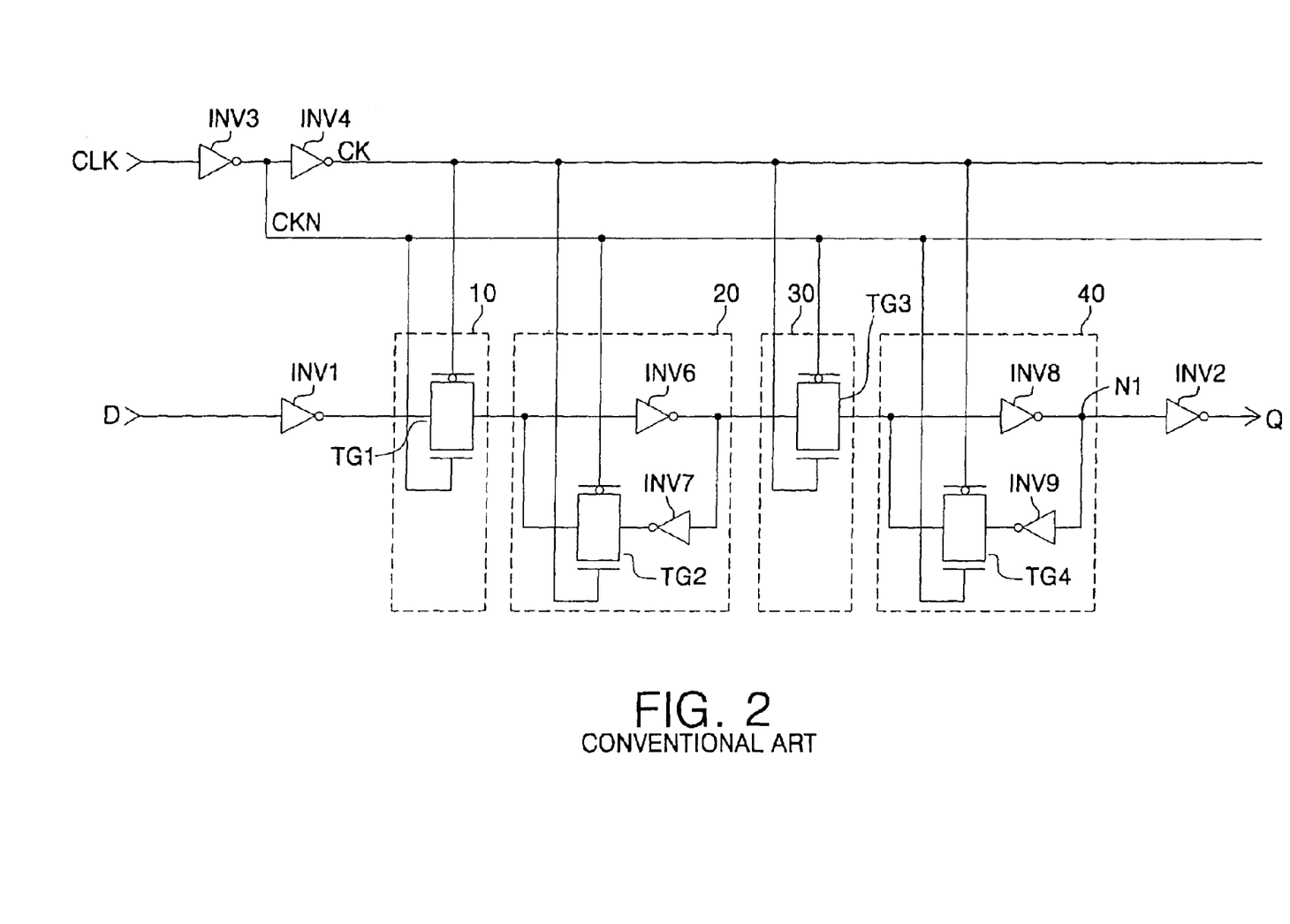
FIG. 2 is a detailed circuit diagram of the flip-flop circuit shown in FIG. 1.

FIG. 1 schematically illustrates a conventional flip-flop circuit, and FIG. 2 illustrates in greater detail the flip-flop circuit shown in FIG. 1. Referring first to FIG. 1, the conventional flip-flop circuit includes a master latch gate 10, a master latch 20, a slave latch gate 30 and a slave latch 40, each being controlled by an external clock signal CLK. Input data D is inverted by an inverter INV1 and applied to the master latch 10, and output data Q is obtained from the inverter INV2 which inverts the output of the slave latch 40.

As shown in FIG. 2, the external clock signal CLK is passed through inverter INV3 to obtain an inverted internal clock signal CKN, and is further passed through inverter INV4 to obtain an internal clock signal CK. The master latch 10 includes a transmission gate TG1 which is controlled by the clock signals CKN and CK. The master latch 20 includes inverter INV6 connected in parallel with inverter INV7 and transmission gate TG2, where the transmission gate TG2 is controlled by the clock signals CKN and CK. The slave latch gate 30 includes a transmission gate TG3 which is controlled by the clock signals CKN and CK. The slave latch 40 includes inverter INV8 connected in parallel with inverter INV9 and transmission gate TG4, where the transmission gate TG4 is controlled by the clock signals CKN and CK.

As shown, the master latch gate 10, the master latch 20, the slave latch gate 30, and the slave latch 40, all have transmission gates which are controlled by the external clock signal CLK. As a consequence, one significant drawback of this conventional flip-flop circuit resides in the substantial load applied to the clock signal line. The high load of the clock signal line results in an increase in the transition time of the clock signal, which in turn creates a roadblock to achieving high operating speeds.

SUMMARY OF THE INVENTION

In accordance with one aspect of the present invention, there is provided a flip-flop circuit which includes a master latch and a slave latch, where a latch operation of the slave latch is controlled by a result of comparison between an output signal of the master latch and an output signal of the slave latch.

In accordance with another aspect of the present invention, there is provided a flip-flop circuit which includes a master latch gate, a master latch, a slave latch gate, a slave latch, and a comparator. The master latch gate is for receiving an input signal and for outputting the input signal under control of a clock signal and an inverted clock signal. The master latch is for receiving the signal output by the master latch gate and for latching the signal output by the master latch gate under control of the clock signal and the inverted clock signal. The slave latch gate is for receiving the signal latched by the master latch and for outputting the signal latched by the master latch under control of the clock signal and the inverted clock signal. The slave latch is for receiving the signal output by the slave latch gate and for latching the signal output by the slave latch gate under control of a slave latch control signal and an inverted slave latch control signal. The comparator is for receiving the signal latched by the master latch, an inverted signal latched by the master latch, the signal latched by the slave latch and an inverted signal latched by the slave latch, and for generating the slave latch control signal and the inverted slave latch control signal.

Preferably, the master latch gate includes a transmission gate which includes a first control terminal for receiving the clock signal, a second control signal for receiving the inverted clock signal, an input terminal for receiving the input signal, and an output terminal for outputting the input signal under control of the clock signal and the inverted clock signal.

Preferably, the master latch includes first and second inverters and a transmission gate. The first inverter is for inverting the signal output by the master latch gate and for outputting the signal latched by the master latch, and the second inverter is for inverting the signal latched by the master latch and for outputting the inverted signal latched by the master latch. The transmission gate includes a first control terminal which receives the inverted clock signal, a second control terminal which receives the clock signal, an input terminal which receives the inverted signal latched by the master latch, and an output terminal which outputs the inverted signal latched by the master latch to an input of the first inverter under control of the clock signal and the inverted clock signal.

Preferably, the slave latch gate includes a transmission gate which includes a first control terminal for receiving the inverted clock signal, a second control signal for receiving the clock signal, an input terminal for receiving the signal latched by the master latch, and an output terminal for outputting the signal latched by the master latch under control of the clock signal and the inverted clock signal.

Preferably, the slave latch includes first and second inverters and a transmission gate. The first inverter is for inverting the output signal of the slave latch gate and generating the signal latched by the slave latch, and the second inverter is for receiving the signal latched by the slave latch and generating the inverted signal latched by the slave latch. The transmission gate includes a first control terminal which receives the slave latch control signal, a second control terminal which receives the inverted slave latch control signal, an input terminal which receives the inverted signal latched by the slave latch, and an output terminal which outputs the inverted signal latched by the slave latch to an input of the first inverter under control of the clock signal and the inverted clock signal.

Preferably, the comparator includes first through fourth transmission gates. The first transmission gate includes a first control terminal for receiving the signal latched by the master latch, a second control terminal for receiving the inverted signal latched by the master latch, an input terminal for receiving the inverted signal latched by the slave latch, and an output terminal for generating the slave latch control signal. The second transmission gate includes a first control terminal for receiving the inverted signal latched by the master latch, a second control terminal for receiving the signal latched by the master latch, an input terminal for receiving the signal latched by the slave latch, and an output terminal for generating the slave latch control signal. The third transmission gate includes a first control terminal for receiving the signal latched by the master latch, a second control signal for receiving the inverted signal latched by the master latch, an input terminal for receiving the signal latched by the slave latch, and an output terminal for generating the inverted slave latch control signal. The fourth transmission gate includes a first control terminal for receiving the inverted signal latched by the master latch, a second control terminal for receiving the signal latched by the master latch, an input terminal for receiving the inverted signal latched by the slave latch, and an output terminal for generating the inverted slave latch control signal.

BRIEF DESCRIPTION OF THE DRAWINGS

These and other features and advantages of the present invention will be readily apparent to those of ordinary skill in the art upon review of the detailed description that follows when taken in conjunction with the accompanying drawings, wherein like numerals denote like parts, and in which.

DETAILED DESCRIPTION OF THE PREFERRED EMBODIMENTS

Hereinafter, preferred embodiments of the present invention will be described in detail with reference to the accompanying drawings. Like reference numerals refer to like elements throughout the drawings.

Figure 3:
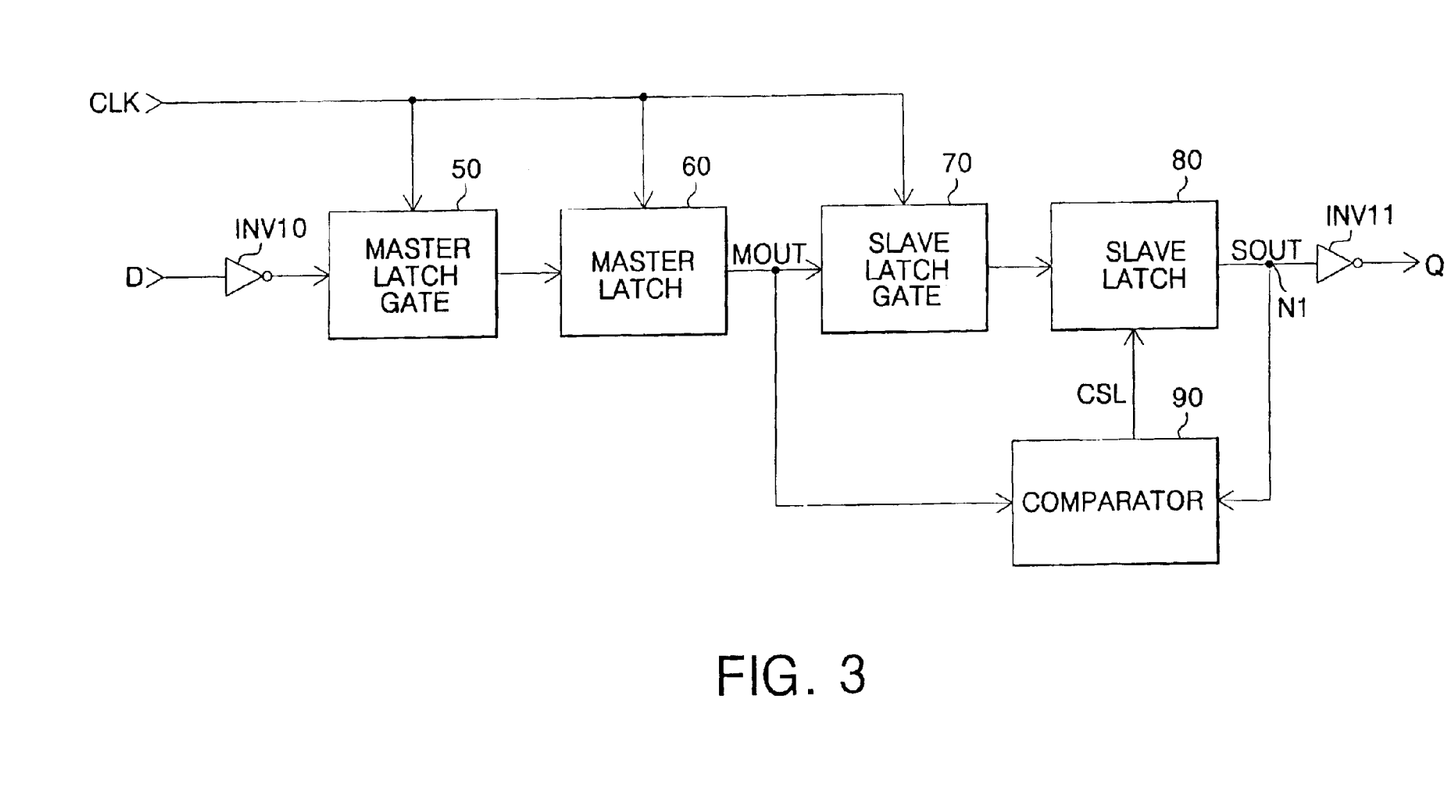
FIG. 3 is a schematic block diagram of a flip-flop circuit in accordance with an embodiment of the present invention.

FIG. 3 schematically illustrates a flip-flop circuit in accordance with an embodiment of the present invention.

Referring to FIG. 3, the flip-flop circuit includes an inverter INV10 for receiving a flip-flop input signal D and outputting an inverted signal of the flip-flop input signal D, a master latch gate 50 for receiving an output of the inverter INV1 and outputting the same under control of an external clock signal CLK, a master latch 60 for receiving an output of the master latch gate 50 and latching the same under control of the external clock signal CLK, a slave latch gate 70 for receiving an output signal MOUT of the master latch 60 and outputting the same under control of the external clock signal CLK, a comparator 90 for comparing the output signal MOUT of the master latch 60 and a signal of a node N1, a slave latch 80 for receiving an output signal of the slave latch gate 70 and latching the same under control of an output signal CSL of the comparator 90, and an inverter INV11 for inverting an output SOUT of the slave latch 80 and outputting the inverted signal Q of the output SOUT of the slave latch 80.

As shown in FIG. 3, the master latch gate 50, the master latch 60, and the slave latch gate 70 are controlled by the external clock signal CLK, but the slave latch 80 is controlled by the output CSL of the comparator 90. In the flip-flop circuit this embodiment, the latching operation of the slave latch 80 is controlled by a comparison signal which is generated by comparing the output signal MOUT of the master latch 60 and the output signal SOUT of the slave latch 80. Since the slave latch 80 is not driven by the external clock signal CLK, the load of the clock signal line is reducee. This allows for a reduction in the transition time of the clock signal, which in turn allows for a reduction in the transmission time of the output signal.

Figure 4:
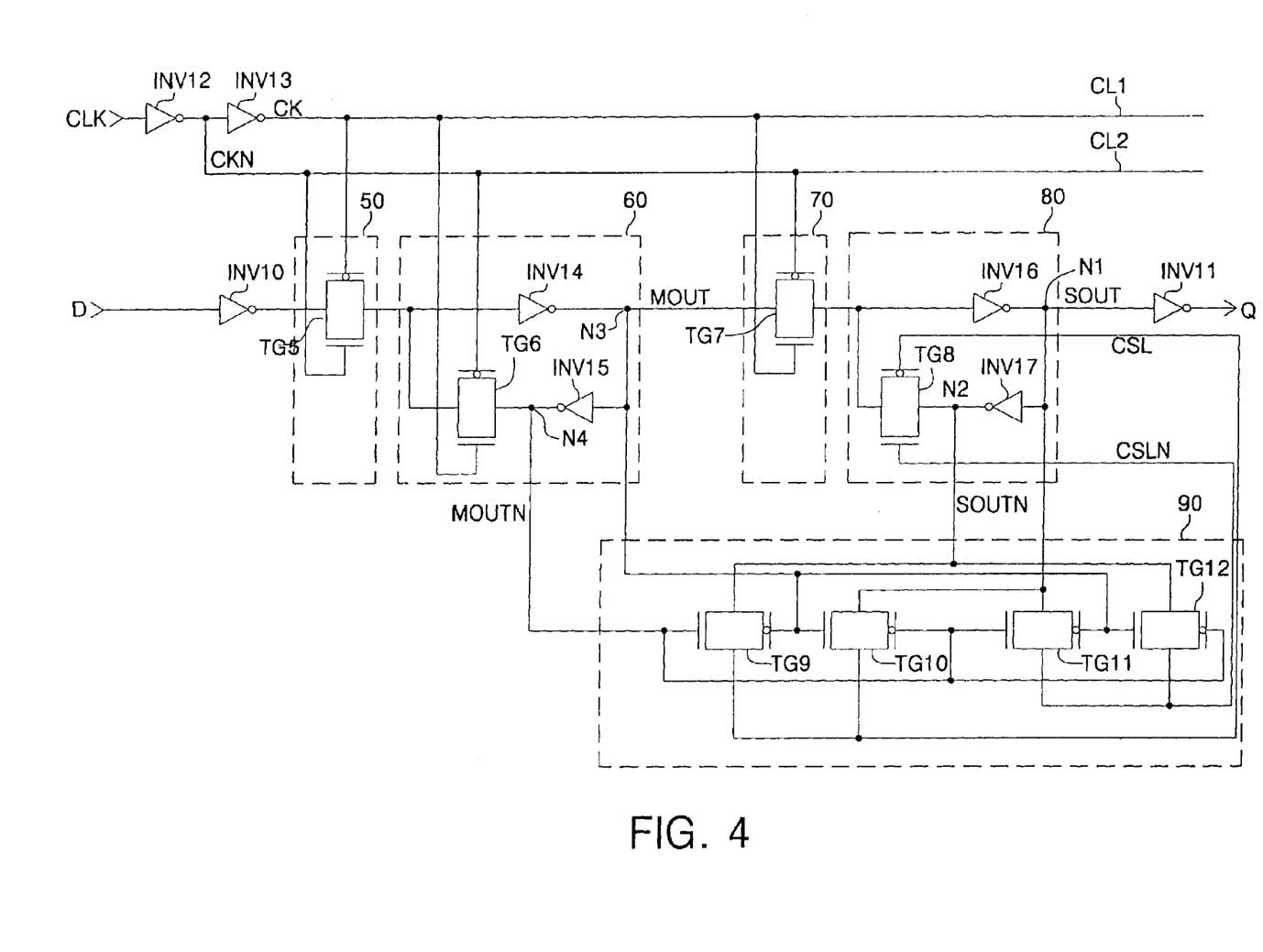
FIG. 4 is a detailed circuit diagram of the flip-flop circuit in accordance with an embodiment of the present invention.

FIG. 4 illustrates a circuit diagram of a flip-flop in accordance with an embodiment of the present invention.

Referring to FIG. 4, the flip-flop includes an inverter INV12 for inverting the external clock signal CLK and generating an inverted internal clock signal CKN to a second clock signal line CL2, an inverter INV13 for inverting the output of the inverter INV12 and generating an internal clock signal CK to a first clock signal line CL1, and an inverter INV10 for receiving the flip-flop input signal D and outputting an inverted flip-flop input signal. The flip-flop further includes a master latch gate 50 for receiving the output of the inverter INV10 and outputting the same under control of the internal clock signal CK and the inverted internal clock signal CKN, a master latch 60 for receiving the output signal of the master latch gate 50 and latching the same therein under control of the internal clock signal CK and the inverted internal clock signal CKN, a slave latch gate 70 for receiving the output signal MOUT of the master latch 60 and outputting the same under control of the internal clock signal CK and the inverted internal clock signal CKN, and a slave latch 80 for receiving the output signal of the slave latch gate 70 and latching the same therein under control of a slave latch control signal CSL and an inverted slave latch control signal CSLN. The flip-flop still further includes a comparator 90 for receiving the output signal MOUT of the master latch 60 and its inverted signal MOUTN, and the output signal SOUT of the slave latch 80 and its inverted signal SOUTN, and for generating the slave latch control signal CSL and the inverted slave latch control signal CSLN, and an inverter INV11 for inverting the output signal SOUT of the slave latch 80 and generating a final output signal Q corresponding to the inverted signal of the output signal SOUT of the slave latch 80.

The master latch gate 50 includes a transmission gate TG5 having an input terminal connected to the output of the inverter INV10, a first control terminal for receiving the internal clock signal CK, and a second control terminal for receiving the inverted internal clock signal CKN.

The master latch 60 includes an inverter INV14 for inverting the output signal of the master latch gate 50 and transmitting the output signal MOUT of the master latch 60 to a node N3, an inverter INV15 for inverting the output signal MOUT of the master latch 60 and transmitting the inverted output signal of the master latch 60 to a node N4, and a transmission gate TG6 having an input terminal connected to the output of the inverter INV15, an output connected to the input of the inverter INV14, a first control terminal for receiving the inverted internal clock signal CKN and a second control terminal for receiving the internal clock signal CK.

The slave latch gate 70 includes a transmission gate TG7 having an input terminal connected to the MOUT output of the inverter INV14, a first control terminal for receiving the inverted internal clock signal CKN, and a second control terminal for receiving the internal clock signal CK.

The slave latch 80 includes an inverter INV16 for inverting the output signal of the transmission gate TG7 of slave latch gate 70 and transmitting an output signal SOUT to a node N1, an inverter INV17 for receiving the output signal SOUT and transmitting the inverted SOUT output signal a node N2, and a transmission gate TG8 having an input terminal connected to the output of the inverter INV17, an output connected to the input of the inverter INV16, a first control terminal for receiving a slave latch control signal CSL, and a second control terminal for receiving an inverted slave latch control signal CSLN.

The comparator 90 includes transmission gates TG9, TG10, TG11 and TG12. The transmission gate TG9 has an input for receiving a signal SOUTN at node N2 of the slave latch 80, a first control terminal for receiving the output signal MOUT at node N3 of the master latch 60, and a second control terminal for receiving the inverted output signal MOUTN at node N4 of the master latch 60. The transmission gate TG10 has an input for receiving a signal SOUT at node N1 of the slave latch 80, a first control terminal for receiving the inverted output signal MOUTN at node N4 of the master latch 60, and a second control terminal for receiving the output signal MOUT at node N3 of the master latch 60. The transmission gate TG11 has an input for receiving a signal SOUT at node N1 of the slave latch 80, a first control terminal for receiving the output signal MOUT at node N3 of the master latch 60, and a second control terminal for receiving the inverted output signal MOUTN at node N4 of the master latch 60. The transmission gate TG12 has an input for receiving a signal SOUTN at node N2 of the slave latch 80, a first control terminal for receiving the inverted output signal MOUTN at node N4 of the master latch 60 and a second control terminal for receiving the output signal MOUT at node N3 of the master latch 60.

The operation of the flip-flop circuit shown in FIG. 4 will be described below. By way of example, it is assumed that the flip-flop circuit shown in FIG. 4 is a clock rising-edge triggered flip-flop.

Referring to FIG. 4, the internal clock signal CK having the same phase as the external clock signal CLK and an inverted internal clock signal CKN having an opposite phase relative to the external clock signal CLK are generated on the clock signal lines CL1 and CL2, respectively.

The transmission gates TG6 and TG8 control the latch operations of the master latch 60 and the slave latch 80, respectively. In the transmission gates of this example, a first control terminal is a gate of a PMOS transistor and a second control terminal is a gate of an NMOS transistor. During a period that the external clock signal CLK is logic "low", the master latch gate 50 is in an on-state and the slave latch 70 is in an off-state. The output signal MOUT of the master latch 60 changes based on the input signal D while the external clock signal CLK is logic "low", but maintains a value previously latched in the master latch 60 while the external clock signal CLK is logic "high".

The slave latch 80 is controlled by the slave latch control signal CSL which is the output signal of the comparator 90 and the inverted slave latch control signal CSLN. The slave latch 80 outputs its own output signal SOUT which changes based on the output signal MOUT of the master latch 60 while the slave latch control signal CSL is logic "high", but outputs the output signal SOUT with a value previously latched in the slave latch 80 while the slave latch control signal CSL is logic "low".

If the input signal D of the flip-flop has a logic value "1" and the internal clock signal CK is a logic value "0", the input signal D is transmitted to the master latch 60 and the output signal MOUT of the master latch 60 is a logic value "1". Then, if the internal clock signal CK becomes a logic value "1", the master latch gate 50 is turned off and the transmission gate TG6 in the master latch 60 is turned on, so that the master latch 60 latches a current logic value. On the other hand, if the internal clock signal CK becomes a logic value "1", the slave latch gate 70 is turned on and output signal MOUT having a logic value "1" of the master latch 60 is input to the slave latch 80. Since the output signal MOUT of the master latch 60 has a logic value "1", the inverted output signal MOUTN of the master latch 60 has a logic "0" value. Accordingly, the transmission gates TG10, TG12 in the comparator 90 are turned on and the transmission gates TG9, TG11 in the comparator 90 are turned off. If the data previously latched in the slave latch 80 has a logic value "1", the inverted output signal SOUTN of the slave latch 80 has a logic value "0", so that a logic value "1" is output through the transmission gate TG10 as the slave latch control signal CSL, and a logic value "0" is output through the transmission gate TG12 as the inverted slave latch control signal CSLN. Since the slave latch control signal CSL has the logic value "1", the transmission gate TG8 is turned off. Accordingly, the output signal MOUT with the logic value "1" of the master latch 60 is inverted and the inverted logic value "0" of the output signal MOUT of the master slave 60 is transmitted to the node N1. The inverted logic value "0" is output from the slave latch 80 as the output signal SOUT of the slave latch 80. The output signal SOUT of the slave latch 80 is inverted by the inverter INV11 and a logic value "1" is output as the final output signal Q. If the previous logic value of the output signal SOUT is "0", the inverted output signal SOUTN of the slave latch 80 has the logic value "1", so that the logic value "0" is output as the slave latch control signal CSL through the transmission gate TG10 and the logic value "1" is output as the inverted slave latch control signal CSLN through the transmission gate TG12. Since the slave latch control signal CSL has the logic value "0", the transmission gate TG8 is turned on, and the slave latch 80 performs the latch operation and the output signal SOUT of the slave latch 80 maintains the previous logic value "0". The output signal SOUT of the slave latch 80 is inverted by the inverter INV11 and the inverted output signal SOUTN, having the logic value "1", is output as the final output signal Q.

If the input signal D of the flip-flop has a logic value "0" and the internal clock signal CK has a logic value "0", the input signal D is delivered to the output of the master latch 60, and the output signal MOUT of the master latch 60 becomes a logic value "0". Then, if the internal clock signal CK changes to a logic value "1", the master latch gate 50 is turned off, and the transmission gate TG6 in the master latch 60 is turned on, and the master latch 60 latches the input data D having the logic value "0". When the internal clock signal has the logic value "1", the slave latch gate 70 is turned on and the output signal MOUT with the logic value "0" of the master latch 60 is input to the slave latch 80. Since the output signal MOUT of the master latch 60 has the logic value "0", the inverted output signal MOUTN of the master latch 60 has the logic value "1". Accordingly, among the transmission gates TG9, TG10, TG1 and TG12 in the comparator 90, only the transmission gates TG9 and TG11 are turned on and the others are turned off. If the previous logic value of the output signal SOUT of the slave latch 80 is a logic value "0", the inverted output signal SOUTN of the slave latch 80 has a logic value "1", so that the logic value "1" is output as the slave latch control signal CSL through the transmission gate TG9 and the logic value "0" is output as the inverted slave latch control signal CSLN through the transmission gate TG11. Since the slave latch control signal CSL has the logic value "1", the transmission gate TG8 is turned off, and the inverted output signal MOUTN having the logic value "1" of the master latch 60 is transmitted to the node N1 and becomes the output signal SOUT of the slave latch 80. The output signal SOUT of the slave latch 80 is inverted by the inverter INV11 and the logic value "0" is output as the final output signal Q of the flip-flop. If the previous logic value of the output signal SOUT of the slave latch 80 is "1", the inverted output signal SOUTN of the slave latch 80 has the logic value "0", so that the logic value "0" is output through the transmission gate TG9 as the slave latch control signal CSL and the logic value "1" is output through the transmission gate TG11 as the slave latch control signal CSLN. Since the slave latch control signal CSL has the logic value "0", the transmission gate TG8 is turned on and the slave latch 80 performs the latch operation. Accordingly, the output signal SOUT of the slave latch 80 maintains the previous logic value "1". The output signal SOUT with the logic value "1" of the slave latch 80 is inverted by the inverter INV11 and output as the final output signal Q with the logic value "0".

The loads of the internal clock signal CK and the inverted internal clock signal CKN in the flip-flop circuit of FIG. 4 are reduced in comparison with the conventional flip-flop circuit shown in FIG. 2. Accordingly, the transition time of the internal clock signal CK and the inverted internal clock signal CKN is reduced. Further, while the clock signal is logic "low", the input signal D delivered to the master latch 60 (the output signal MOUT of the master latch 60) is compared with the data stored in the slave latch 80 (the output signal SOUT of the slave latch 80). The node N2 is then made to be in a floating state if the output signal MOUT of the master latch 60 and the output signal SOUT of the slave latch 80 are inconsistent by turning off the transmission gate TG8 in the slave latch 80. As such, the data transmission time from the input of the input signal D to the output of the final data Q may be reduced.

Figure 5:
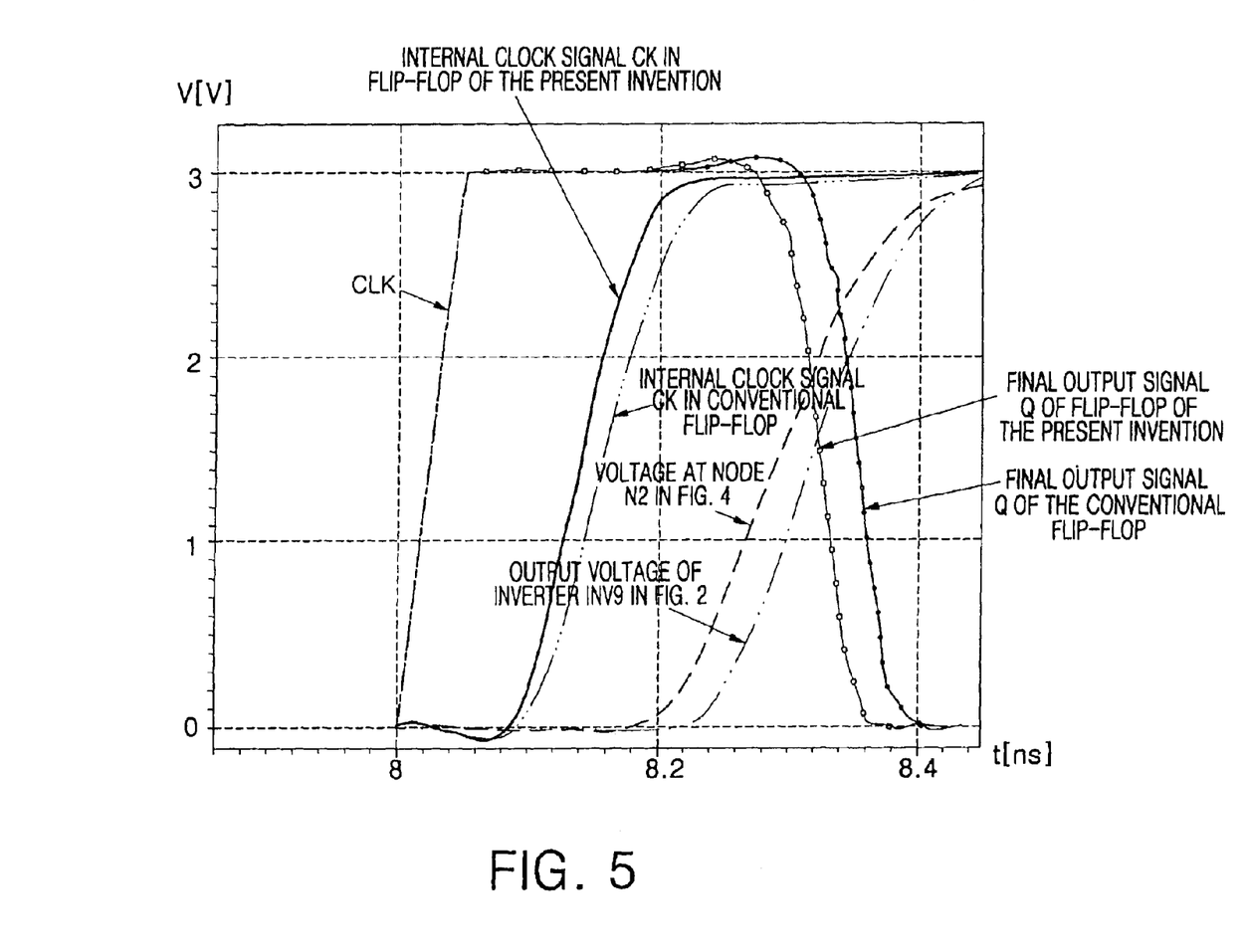
FIG. 5 is a graph showing a simulated clock signal and simulated output signals for comparison between the conventional flip-flop circuit and the flip-flop circuit of the embodiment of the present invention.

FIG. 5 is a graph showing a simulated clock signal and simulated output signals for comparison between the conventional flip-flop circuit and the flip-flop circuit of the embodiment of the present invention. As shown in FIG. 5, transition of the internal clock signal CK of the flip-flop circuit of the present invention occurs faster than that of the conventional flip-flop circuit, and the data transmission time of the flip-flop circuit of the present invention is shorter than that of the conventional flip-flop circuit.

The description above relates to a rising-edge triggered flip-flop, but the invention may also be applied to a falling-edge triggered flip-flop.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A flip-flop circuit comprising:
   a master latch gate for receiving an input signal and for outputting the input signal under control of a clock signal and an inverted clock signal;
   a master latch for receiving the signal output by the master latch gate and for latching the signal output by the master latch gate under control of the clock signal and the inverted clock signal;
   a slave latch gate for receiving the signal latched by the master latch and for outputting the signal latched by the master latch under control of the clock signal and the inverted clock signal;
   a slave latch for receiving the signal output by the slave latch gate and for latching the signal output by the slave latch gate under control of a slave latch control signal and an inverted slave latch control signal; and
   a comparator for receiving the signal latched by the master latch, an inverted signal latched by the master latch, the signal latched by the slave latch and an inverted signal latched by the slave latch, and for generating the slave latch control signal and the inverted slave latch control signal.

2. The flip-flop circuit according to claim 1, wherein the master latch gate comprises a transmission gate which includes a first control terminal for receiving the clock signal, a second control signal for receiving the inverted clock signal, an input terminal for receiving the input signal, and an output terminal for outputting the input signal under control of the clock signal and the inverted clock signal.

3. The flip-flop circuit according to claim 1, wherein the master latch comprises:
   a first inverter for inverting the signal output by the master latch gate and for outputting the signal latched by the master latch;
   a second inverter for inverting the signal latched by the master latch and for outputting the inverted signal latched by the master latch; and
   a transmission gate including a first control terminal which receives the inverted clock signal, a second control terminal which receives the clock signal, an input terminal which receives the inverted signal latched by the master latch, and an output terminal which outputs the inverted signal latched by the master latch to an input of the first inverter under control of the clock signal and the inverted clock signal.

4. The flip-flop circuit according to claim 1, wherein the slave latch gate comprises a transmission gate which includes a first control terminal for receiving the inverted clock signal, a second control signal for receiving the clock signal, an input terminal for receiving the signal latched by the master latch, and an output terminal for outputting the signal latched by the master latch under control of the clock signal and the inverted clock signal.

5. The flip-flop circuit according to claim 1, wherein the slave latch comprises:
   a first inverter for inverting the output signal of the slave latch gate and generating the signal latched by the slave latch;
   a second inverter for receiving the signal latched by the slave latch and generating the inverted signal latched by the slave latch; and
   a transmission gate including a first control terminal which receives the slave latch control signal, a second control terminal which receives the inverted slave latch control signal, an input terminal which receives the inverted signal latched by the slave latch, and an output terminal which outputs the inverted signal latched by the slave latch to an input of the first inverter under control of the clock signal and the inverted clock signal.

6. The flip-flop circuit according to claim 1, wherein the comparator comprises:

a first transmission gate which includes a first control terminal for receiving the signal latched by the master latch, a second control terminal for receiving the inverted signal latched by the master latch, an input terminal for receiving the inverted signal latched by the slave latch, and an output terminal for generating the slave latch control signal;

a second transmission gate which includes a first control terminal for receiving the inverted signal latched by the master latch, a second control terminal for receiving the signal latched by the master latch, an input terminal for receiving the signal latched by the slave latch, and an output terminal for generating the slave latch control signal;

a third transmission gate which includes a first control terminal for receiving the signal latched by the master latch, a second control signal for receiving the inverted signal latched by the master latch, an input terminal for receiving the signal latched by the slave latch, and an output terminal for generating the inverted slave latch control signal; and a fourth transmission gate which includes a first control terminal for receiving the inverted signal latched by the master latch, a second control terminal for receiving the signal latched by the master latch, an input terminal for receiving the inverted signal latched by the slave latch, and an output terminal for generating the inverted slave latch control signal.

7. The flip-flop circuit according to claim 2, wherein the first control terminal of the transmission gate is a gate of a PMOS transistor and the second control terminal of the transmission gate is a gate of an NMOS transistor.

8. The flip-flop circuit according to claim 3, wherein the first control terminal of the transmission gate is a gate of a PMOS transistor and the second control terminal of the transmission gate is a gate of an NMOS transistor.

9. The flip-flop circuit according to claim 4, wherein the first control terminal of the transmission gate is a gate of a PMOS transistor and the second control terminal of the transmission gate is a gate of an NMOS transistor.

10. The flip-flop circuit according to claim 5, wherein the first control terminal of the transmission gate is a gate of a PMOS transistor and the second control terminal of the transmission gate is a gate of an NMOS transistor.

11. The flip-flop circuit according to claim 6, wherein the first control terminal of each of the first through fourth transmission gates is a gate of a PMOS transistor and the second control terminal of each of the first through fourth transmission gates is a gate of an NMOS transistor.

12. The flip-flop circuit according to claim 6, wherein the master latch comprises:

a first inverter for inverting the signal output by the master latch gate and for outputting the signal latched by the master latch;

a second inverter for inverting the signal latched by the master latch and for outputting the inverted signal latched by the master latch; and a fifth transmission gate including a first control terminal which receives the inverted clock signal, a second control terminal which receives the clock signal, an input terminal which receives the inverted signal latched by the master latch, and an output terminal which outputs the inverted signal latched by the master latch to an input of the first inverter under control of the clock signal and the inverted clock signal.

13. The flip-flop circuit according to claim 12, wherein the slave latch comprises:

a third inverter for inverting the output signal of the slave latch gate and generating the signal latched by the slave latch;

a fourth inverter for receiving the signal latched by the slave latch and generating the inverted signal latched by the slave latch; and a sixth transmission gate including a first control terminal which receives the slave latch control signal, a second control terminal which receives the inverted slave latch control signal, an input terminal which receives the inverted signal latched by the slave latch, and an output terminal which outputs the inverted signal latched by the slave latch to an input of the third inverter under control of the clock signal and the inverted clock signal.

14. A flip-flop circuit comprising:

a master circuit for receiving an input signal to generate a master output signal in response to a clock signal and latching the master output signal in response to an inverted signal of the clock signal;

a slave circuit for receiving the master output signal to generate a slave output signal in response to the clock signal and latching the slave output signal in response to a control signal; and, a comparator for comparing the master output signal with the slave output signal to generate the control signal;

wherein the master circuit comprises:

a master latch gate for receiving the input signal in response to the clock signal; and, a master latch for inputting an output signal of the master latch gate to generate the master output signal and latching the master output signal in response to the inverted signal of the clock signal;

wherein the slave circuit comprises:

a slave latch sate for receiving the master output signal in response to the clock signal; and, a slave latch for inputting an output signal of the slave latch gate to generate the slave output signal and latching the slave output signal in response to the control signal;

wherein the slave latch comprises:

a first inverter for inverting the output signal of the slave latch gate to generate an inverted signal of the slave output signal; and, a second inverter for inverting the inverted signal of the slave output signal to generate a second signal;

wherein the comparator generates the control signal as logic "low" when the master output signal is not matched with the slave output signal, and generates the control signal as logic "high" when the master output signal is matched with the slave output signal; and, the slave latch does not latch the slave output signal when the control signal is generated as logic "low", and latches the slave output signal when the control signal is generated as logic "high"; and, wherein the comparator comprises:

third and fourth transmission gates for transmitting the inverted signal of the slave output signal and the second signal as the control signal in response to the master output signal, respectively; and fifth and sixth transmission gates for transmitting the second signal and the inverted signal of the slave output signal as the control signal in response to the inverted signal of the master output signal, respectively.

* * * * *